US009993843B2

(12) United States Patent
Aldaz et al.

(10) Patent No.: US 9,993,843 B2
(45) Date of Patent: Jun. 12, 2018

(54) ADAPTER FOR ULTRASONIC TRANSDUCER ASSEMBLY

(71) Applicant: Dukane Corporation, St. Charles, IL (US)

(72) Inventors: Robert E. Aldaz, St. Charles, IL (US); Leo M. Klinstein, Glenview, IL (US); Charles L. Leonard, Naperville, IL (US)

(73) Assignee: Dukane IAS, LLC, St. Charles, IL (US)

( * ) Notice: Subject to any disclaimer, the term of this patent is extended or adjusted under 35 U.S.C. 154(b) by 793 days.

(21) Appl. No.: 14/326,900

(22) Filed: Jul. 9, 2014

(65) Prior Publication Data

US 2015/0015115 A1 Jan. 15, 2015

Related U.S. Application Data

(60) Provisional application No. 61/846,162, filed on Jul. 15, 2013.

(51) Int. Cl.
*H01L 41/09* (2006.01)
*H01L 41/107* (2006.01)
*B06B 3/00* (2006.01)

(52) U.S. Cl.
CPC ..................................... *B06B 3/00* (2013.01)

(58) Field of Classification Search
CPC ....................................................... B06B 3/00
(Continued)

(56) References Cited

U.S. PATENT DOCUMENTS 4,325,255 A * 4/1982 Howard .............. G01F 23/2961 310/316.01
4,757,227 A * 7/1988 Danley ..................... B06B 3/02 181/0.5

(Continued)

FOREIGN PATENT DOCUMENTS

AU 2012/202212 11/2012
WO WO 1999/001235 1/1999

(Continued)

*Primary Examiner* — Thomas Dougherty
(74) *Attorney, Agent, or Firm* — Nixon Peabody LLP

(57) ABSTRACT

Ultrasonic transducer coupling adapters, ultrasonic transducer assemblies with an adapter, and methods for making and for using ultrasonic transducer adapter components are disclosed. An ultrasonic transducer assembly is disclosed for generating and transmitting ultrasonic energy to a work piece (e.g., non-resonant structures). The assembly includes piezoelectric actuators that generate ultrasonic vibrations in response to high-frequency electrical signals. A feedback system monitors and regulates voltages applied to the piezoelectric actuators. The assembly also includes an adapter that is connected to the piezoelectric actuators (e.g., via a front mass) and is configured to distribute the ultrasonic vibrations from the actuators to the work piece. The adapter reduces or substantially eliminates transmission back to the piezoelectric actuators of erratic strain generated by the work piece in response to these ultrasonic vibrations. The adapter helps to ensure that the ultrasonic transducer assembly vibrates with a simple axial motion when the work piece vibrates erratically.

6 Claims, 4 Drawing Sheets

(58) Field of Classification Search
USPC .. 310/316.01, 317, 323.12, 323, 18, 323.19, 310/323.18
See application file for complete search history.

(56) References Cited

U.S. PATENT DOCUMENTS

| | | | | |
|---|---|---|---|---|
| 4,836,684 | A * | 6/1989 | Javorik | B08B 3/12 134/1 |
| 5,322,055 | A | 6/1994 | Davison et al. | |
| 5,485,053 | A | 1/1996 | Baz | |
| 5,828,156 | A * | 10/1998 | Roberts | B06B 3/00 310/317 |
| 5,989,275 | A | 11/1999 | Estabrook et al. | |
| 6,036,667 | A | 3/2000 | Manna et al. | |
| 6,468,286 | B2 | 10/2002 | Mastri et al. | |
| 6,605,178 | B1 * | 8/2003 | Shinohara | B29C 65/08 156/379.6 |
| 6,661,157 | B1 | 12/2003 | Lundblad | |
| 6,947,697 | B2 * | 9/2005 | Fujimoto | G03G 15/2028 219/216 |
| 7,393,501 | B2 | 7/2008 | Zumeris et al. | |
| 7,442,168 | B2 | 10/2008 | Novak et al. | |
| 7,479,148 | B2 | 1/2009 | Beaupre | |
| 8,159,111 | B2 * | 4/2012 | Yang | H02K 11/20 310/317 |
| 8,276,445 | B2 | 10/2012 | Reiche | |
| 8,408,445 | B1 * | 4/2013 | Cai | B23K 20/26 156/73.5 |
| 8,910,727 | B2 * | 12/2014 | Bar-Cohen | B25D 11/064 173/142 |
| 2002/0165577 | A1 | 11/2002 | Witt et al. | |
| 2003/0001456 | A1 * | 1/2003 | Kauf | B06B 3/00 310/323.18 |
| 2006/0043837 | A1 * | 3/2006 | Tessien | G10K 15/043 310/323.12 |
| 2006/0149169 | A1 * | 7/2006 | Nunomura | A61B 8/546 601/2 |
| 2009/0143797 | A1 | 6/2009 | Smith et al. | |
| 2012/0216576 | A1 | 8/2012 | Boughton | |
| 2013/0006265 | A1 | 1/2013 | Crandall et al. | |

FOREIGN PATENT DOCUMENTS

| | | |
|---|---|---|
| WO | WO 2000/019243 | 4/2000 |
| WO | WO 2003/051531 | 6/2003 |
| WO | WO 2006/074323 | 7/2006 |
| WO | WO 2009/111436 | 9/2009 |
| WO | WO 2012/118722 A2 | 9/2012 |
| WO | WO 2012/118722 A3 | 11/2012 |

* cited by examiner

ADAPTER FOR ULTRASONIC TRANSDUCER ASSEMBLY

CLAIM OF PRIORITY AND CROSS-REFERENCE TO RELATED APPLICATION

This application claims the benefit of priority to U.S. Provisional Patent Application No. 61/846,162, which was filed on Jul. 15, 2013, and is incorporated herein by reference in its entirety and for all purposes.

TECHNICAL FIELD

The present disclosure relates generally to ultrasonic transducer assemblies and, more particularly, to adapters for an ultrasonically tuned transducer.

BACKGROUND

Ultrasonic transducers are devices that convert energy into sound, typically in the nature of ultrasonic vibrations—sound waves that have a frequency above the normal range of human hearing. One of the most common types of ultrasonic transducers in modern use is the piezoelectric ultrasonic transducer which converts electric signals into mechanical vibrations. Piezoelectric materials are materials, traditionally crystalline structures and ceramics, which produce a voltage in response to the application of a mechanical stress. Since this effect also applies in the reverse, a voltage applied across a sample piezoelectric material will produce a mechanical stress within the sample. For example, activation of some piezoelectric materials results in a change of shape with up to a 4% volumetric variance. Suitably designed structures made from these materials can therefore be made that bend, expand, or contract when a current is applied thereto.

Many ultrasonic transducers are tuned structures that contain piezoelectric ("piezo") ceramic rings. The piezo ceramic rings are typically made of a material, such as lead zirconium titanate ceramic (more commonly referred to as "PZT"), which have a proportional relationship between their applied voltage and mechanical strain (e.g., thickness) of the rings. The supplied electrical signal is typically provided at a frequency that matches the resonant frequency of the ultrasonic transducer. In reaction to this electrical signal, the piezo ceramic rings expand and contract to produce large-amplitude vibrational motion. For example, a 20 kHz ultrasonic transducer typically produces 20 microns of vibrational amplitude. The electrical signals are often provided as a sine wave by a power supply that regulates the signal so as to produce consistent amplitude mechanical vibrations and protect the mechanical structure against excessive strain or abrupt changes in amplitude or frequency.

Typically, the ultrasonic transducer is connected to an ultrasonic booster and a sonotrode (or "horn"), both of which are normally tuned to have a resonant frequency which matches that of the ultrasonic transducer. The ultrasonic booster, which is structured to permit mounting of the ultrasonic transducer assembly (or "stack"), is typically a tuned half-wave component that is configured to increase or decrease the vibrational amplitude passed between the converter (transducer) and sonotrode (horn). The amount of increase or decrease in amplitude is referred to as "gain." The horn, which is oftentimes a tapering metal bar, is structured to augment the oscillation displacement amplitude provided by the ultrasonic transducer and thereby increase or decrease the ultrasonic vibration and distribute it across a desired work area.

Typically, all of the mechanical components used in an ultrasonic transducer assembly must be structured so that they operate at a single resonant frequency that is near or at a desired operating frequency. In addition, the ultrasonic transducer assembly must often operate with a vibrational motion that is parallel to the primary axis (i.e., the central longitudinal axis) of the assembly. The power supply for the stack generally operates as part of a closed-loop feedback system which monitors and regulates the applied voltage. Such a system works well when the ultrasonic assembly vibrates in response to a single mechanical resonance in a direction parallel to the primary axis of the ultrasonic transducer stack.

For some applications, it is desirable to ultrasonically vibrate non-tuned structures that have one or more non-axial mechanical resonant frequencies. The purpose of doing so may be to reduce friction when installing a non-tuned structure into or onto a larger assembly, or to reduce friction between a non-tuned structure and a material flowing through that structure, such as in a production environment. The presence of non-axial mechanical resonances in a typical non-tuned structure will often result in such resonances existing in or otherwise transferring back to the stack. Such resonances typically are random in nature rather than the expected single axial resonance on a fully tuned stack. As a result, the strain of the piezoelectric rings contained in the ultrasonic transducer tends to be more erratic. This tends to produce unrepeatable results when an ultrasonic power supply is used to regulate vibrational amplitude. There is therefore a need for an ultrasonic transducer assembly that is adapted to minimize or eliminate erratic strain on the piezoelectric rings which, in turn, will help to ensure more consistent, repeatable output by the stack during normal operation thereof.

SUMMARY

Aspects of the present disclosure are directed to an adapter component that is configured to be installed between an ultrasonic transducer and a non-tuned (or non-resonant) structure, thereby creating an assembly (or "stack"). The nature of this adapter is to help ensure that the ultrasonic transducer assembly vibrates with a simple axial motion while the non-tuned structure vibrates in an erratic manner that is created by the many random resonances that exist within that structure. By maintaining the axial motion of the ultrasonic transducer assembly, the reliability of the power supply's closed-loop regulation of the ultrasonic assembly is increased.

Other aspects of this disclosure are directed to an ultrasonic transducer assembly with an adapter component that is mounted between the stack and a non-resonant structure. The adapter component can be made of a metallic material that is commonly used in ultrasonic structures, such as aluminum or titanium. The shape of the adapter component is designed to transfer substantial ultrasonic vibrations from the ultrasonic transducer assembly to the non-resonant structure without imparting non-axial motion back to the transducer assembly. Such a design will minimize or eliminate erratic strain on stack which, in turn, will help ensure more consistent, repeatable output by the stack during normal operation thereof.

In some embodiments, the adapter component couples to the non-resonant structure by a predetermined pattern of bolt holes, and abuts the non-resonant structure with a raised contact surface that is separate and offset from the bolt pattern. The adapter is configured such that the raised contact surface (or pad) is the location of maximum vibrational amplitude when the adapter is excited by the ultrasonic transducer assembly. Separation of the bolt pattern from the raised pad allows the connection between the adapter component and the non-resonant structure to have greater elasticity than a direct connection. This configuration reduces the amount of non-axial motion that can be transferred from the non-resonant structure to the ultrasonic transducer.

In some embodiments, the adapter component is a single-piece, integrally formed frustaconical structure. For some configurations, the outer diameter of the adapter component increases in the direction of the non-resonant structure such that the vibrational amplitude of the adapter is maximized at a raised contact surface which abuts the non-resonant structure. It may also be desirable that the transition in diameter is gradual enough to avoid excessive stress in the adapter component.

Aspects of the present disclosure are directed to an ultrasonic transducer assembly for generating and transmitting ultrasonic energy to a work piece. In some optional implementations, the assembly is a Langevin-type piezoelectric transducer. The ultrasonic transducer assembly includes a plurality of piezoelectric actuators (e.g., a stack of PZT rings) configured to generate ultrasonic vibrations in response to high-frequency electrical signals. A feedback system monitors and regulates voltages applied to the piezoelectric actuators. The assembly also includes an adapter that is operatively connected to the piezoelectric actuators (e.g., via a front “head” mass), and is configured to distribute the ultrasonic vibrations from the piezoelectric actuators to the work piece. The adapter is configured to at least partially (if not substantially or completely) reduce transmission back to the piezoelectric actuators of erratic strain generated by the work piece in response to these ultrasonic vibrations.

Other aspects of the present disclosure are directed to a coupler adapter for an ultrasonic transducer assembly operable to generate and transmit ultrasonic energy to a non-resonant structure. The coupling adapter includes or, optionally, may consist essentially or solely of a frustaconical integrally formed single-piece body with opposing proximal and distal ends. The proximal end is configured to couple to the ultrasonic transducer assembly. The distal end has a raised contact surface that partially or completely circumscribes a recessed attachment surface. The raised contact surface is configured to abut the non-resonant structure, while the recessed attachment surface is configured to couple to the non-resonant structure. The proximal end has a first diameter while the distal end has a second diameter that is larger than the first diameter.

In accordance with other aspects of the present disclosure, a method is presented for using an ultrasonic transducer assembly on a work piece. The ultrasonic transducer assembly includes piezoelectric actuators for generating ultrasonic vibrations in response to electrical signals. The method includes: attaching an adapter to the ultrasonic transducer assembly such that the adapter receives the ultrasonic vibrations from the piezoelectric actuators; attaching the adapter to the work piece such that the adapter distributes the ultrasonic vibrations from the piezoelectric actuators to the work piece; and, introducing a high-frequency electrical signal to the piezoelectric actuators. The adapter is configured to at least partially reduce transmission back to the piezoelectric actuators of erratic strain generated by the work piece in response to the ultrasonic vibrations. Methods for making adapter components for an ultrasonic transducer assembly are also disclosed herein.

The above summary is not intended to represent each embodiment or every aspect of the present disclosure. Rather, this summary merely provides an exemplification of some of the novel features presented herein. The above features and advantages, and other features and advantages of the present disclosure, will be readily apparent from the following detailed description of exemplary embodiments and modes for carrying out the present invention when taken in connection with the accompanying drawings and the appended claims.

Figure 1:
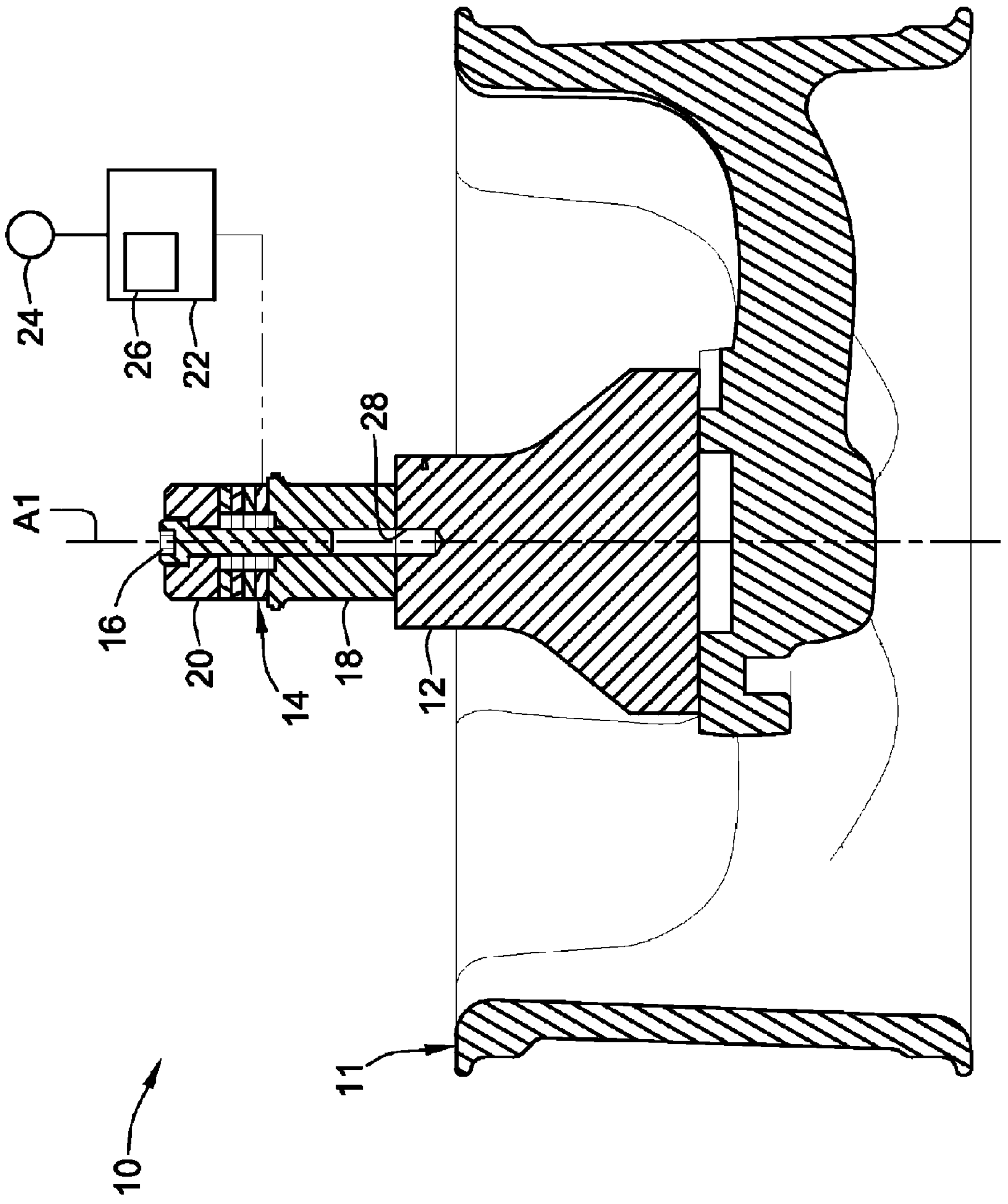
FIG. 1 is a cross-sectional front-view illustration of an example of an ultrasonic transducer assembly with a representative adapter according to aspects of the present disclosure.

While aspects of this disclosure are susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

This invention is susceptible of embodiment in many different forms. There are shown in the drawings and will herein be described in detail representative embodiments of the invention with the understanding that the present disclosure is to be considered as an exemplification of the principles of the invention and is not intended to limit the broad aspects of the invention to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference or otherwise. For purposes of the present detailed description, unless specifically disclaimed: the singular includes the plural and vice versa; the words “and” and “or” shall be both conjunctive and disjunctive; the word “all” means “any and all”; the word “any” means “any and all”; and the words “including” and “comprising” mean “including without limitation.” Moreover, words of approximation, such as “about,” “almost,” “substantially,” “approximately,” and the like, can be used herein in the sense of “at, near, or nearly at,” or "within 3-5% of," or "within acceptable manufacturing tolerances," or any logical combination thereof, for example.

Referring now to the drawings, wherein like reference numbers refer to like components throughout the several views, there is shown in FIG. 1 an example of an ultrasonic transducer assembly, designated generally as 10, with a representative adapter 12 according to aspects of the present disclosure. The adapter 12 (also referred to herein as "adapter component" or "coupling adapter") is described herein in the context of an automobile tire mounting assembly, which is intended solely to offer a representative application by which some of the novel aspects and features of the present invention may be incorporated and practiced. Accordingly, the present invention is by no means limited to the particular configuration and application illustrated in FIG. 1. In addition, the drawings presented herein are not necessarily to scale and are provided purely for explanatory purposes. Thus, the individual and relative dimensions shown in the drawings are not to be considered limiting unless explicitly stated otherwise in the claims.

The ultrasonic transducer assembly 10 is operable for generating and transmitting ultrasonic energy to a work piece, such as a cylindrical automobile tire wheel 11. It may be desirable, for some implementations, that the work piece be a non-tuned, non-resonant structure that has at least one or, more commonly, a multitude of non-axial mechanical resonant frequencies. The illustrated ultrasonic transducer assembly 10 includes a plurality of piezoelectric actuators, generally designated 14 in FIG. 1, that is configured to generate ultrasonic vibrations in response to electrical signals. These piezoelectric actuators 14, each of which may be a ring-shaped lead zirconium titanate (PZT) ceramic element that is polarized in the thickness direction, are disposed immediately adjacent each other and stacked about a clamping bolt 16. Columnar-shaped front and back masses 18 and 20, respectively, function as clamping members through cooperation with the clamping bolt 16 for clamping together the piezoelectric actuators 14. On a peripheral surface or a front or rear face of each piezoelectric actuator is a positive or negative electrode (not shown). When the piezoelectric stack 14 is subjected to an oscillating voltage, the ceramic piezoelectric elements expand and contract along a primary axis A1 (i.e., the central longitudinal axis) of the assembly 10, thereby causing rapid longitudinal movement (i.e., longitudinal vibration at ultrasonic frequencies) in the adapter 12 and, thereby, in the work piece 11 which is attached at a distal end of the adapter 12. Although not per se required, the ultrasonic transducer assembly 10 may be in the nature of a Langevin-type piezoelectric transducer.

A feedback system, which is shown schematically at 22 in FIG. 1, is operable to monitor and regulate the voltage applied to the piezoelectric actuators 14. The feedback system 22 may be a closed-loop feedback system which includes or is electrically connected to a power source 24 and a controller 26. Only selected components of the feedback system 12 have been shown and will be described hereinbelow. Nevertheless, the feedback system 12 can include numerous additional and/or alternative components, such as an injection oscillator, a band pass active filter, a low pass active filter, and a variable gain amplifier. The injection oscillator may provide an initial voltage signal at a frequency near the transducer resonant frequency. That initial signal can be disengaged from the loop of the feedback system 12 once the driving circuit provides a signal strong enough to maintain transducer oscillation. The band pass and low pass filters can provide the appropriate frequency selectivity and phase shift characteristics to maintain the strength of the transducer feedback signal while the transducer phase characteristics vary over a normal operating range.

The coupling adapter 12 is operatively connected to the piezoelectric actuators 14 and work piece 11, and is configured to distribute ultrasonic vibrations from the piezoelectric actuators 14 to the work piece 11. A proximal end of the adapter 12 can be joined to the front mass 18, for example, by way of a ½ inch×20 inch (½-20) UNF coupling stud (not shown) received in a complementary countersunk ½-20 UNF bolt cavity 28, the front mass 18 in turn being joined to the actuators 14 via the clamping bolt 16 in the manner described above. In so doing, the front mass 18 serves as a vibration transmitter from the actuator stack 14 to the adapter 12 and, optionally, as a waveguide and booster to increase the amplitude of the ultrasonic vibrations that are produced by the stack 14.

Figure 2:
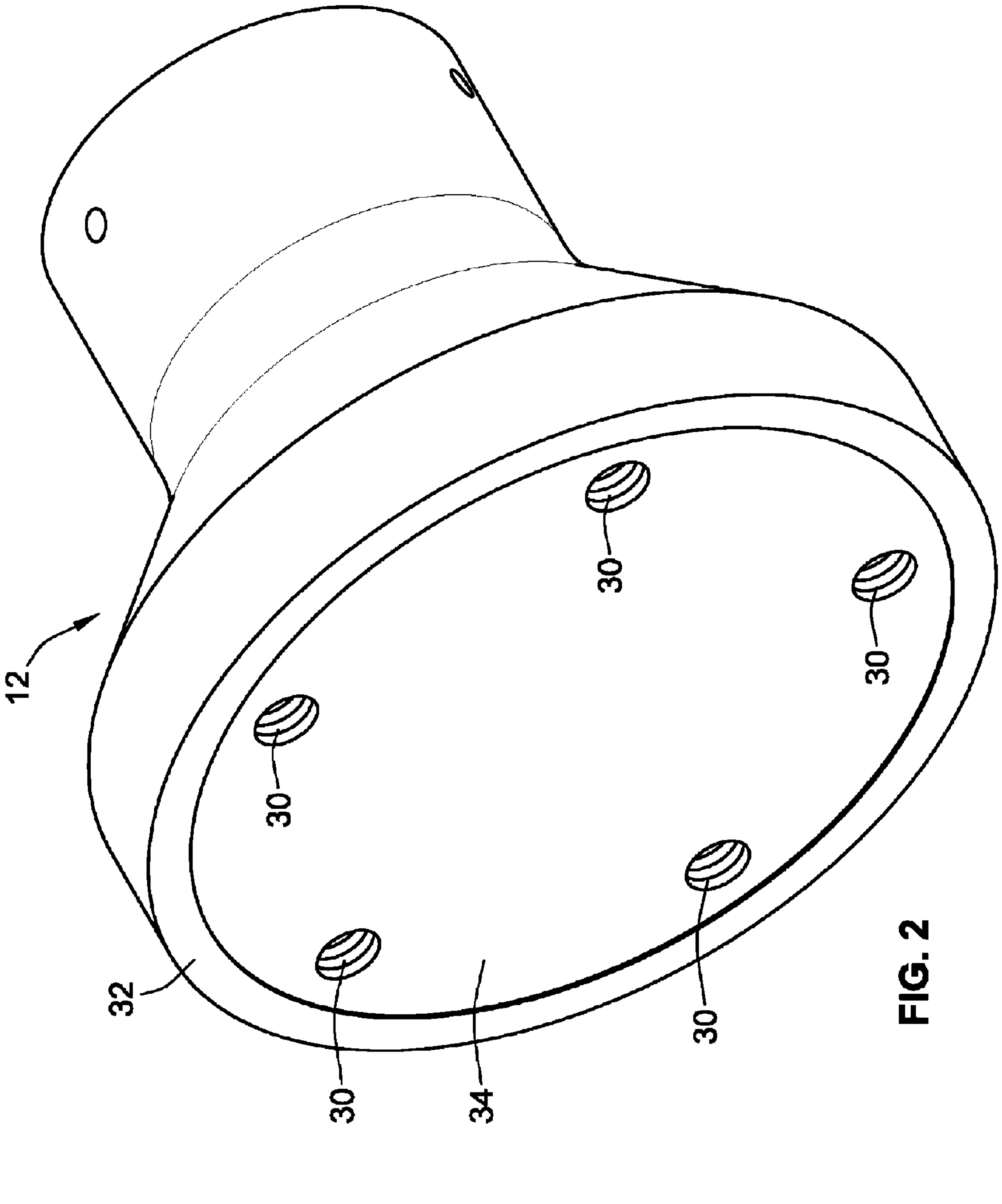
FIG. 2 is a perspective-view illustration of the exemplary adapter of FIG. 1.
Figure 3:
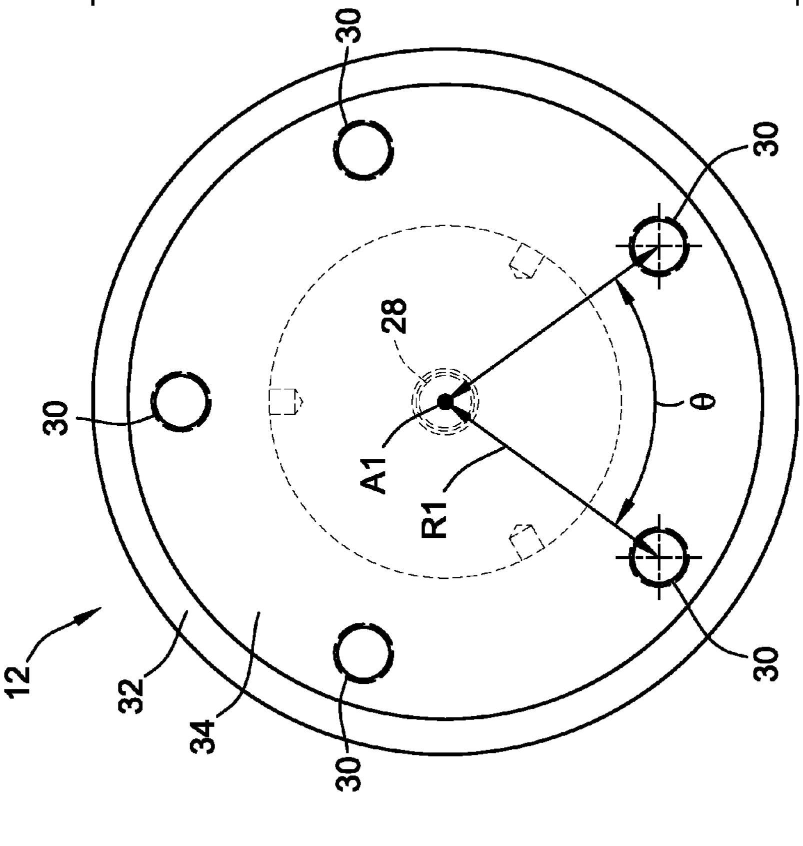
FIG. 3 is a bottom-view illustration of the exemplary adapter of FIG. 1.

A distal end of the adapter 12, which is in opposing spaced relation to the proximal end to which is attached the front mass 18, is configured to mechanically couple to the work piece 11, for example, via a predetermined pattern of five countersunk bolt holes 30. Each bolt hole 30 may be a ½-20 UNF countersunk hole operable to receive therein a standard automobile wheel lug nut. The bolt pattern is shown in FIGS. 2 and 3 corresponding to a standard wheel rim configuration, wherein each bolt hole 30 is spaced radially outward from the central longitudinal axis A1 of the adapter 12 a distance R1 of approximately 2.25 inches, and is spaced circumferentially from adjacent bolt holes 30 by an angle Ø of approximately 72 degrees.

Figure 4:
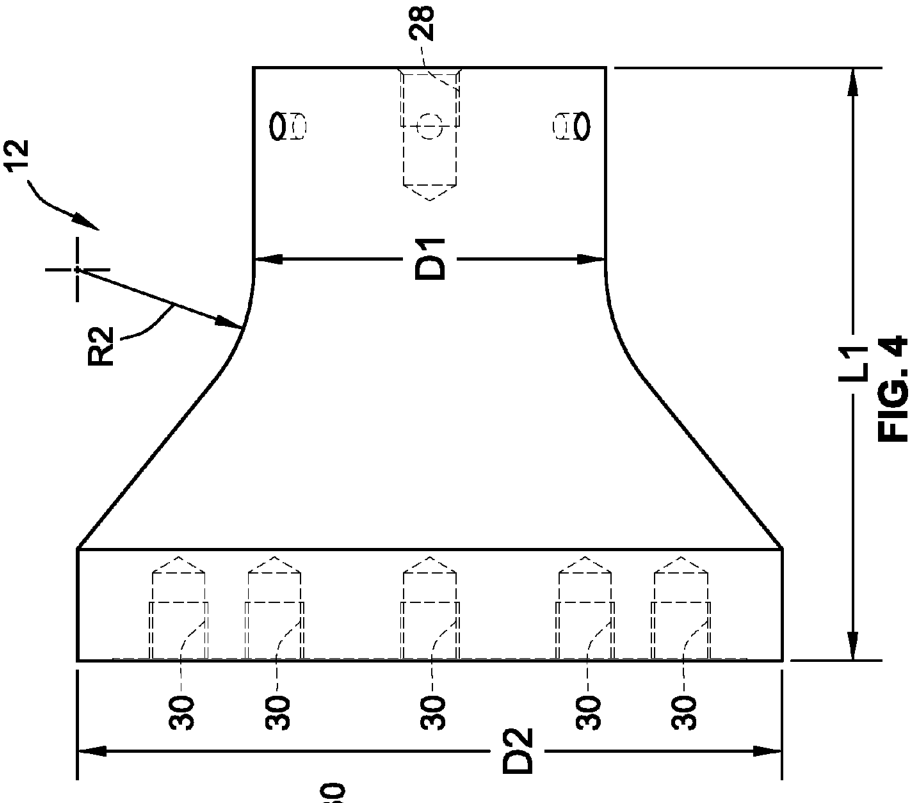
FIG. 4 is a side-view illustration of the exemplary adapter of FIG. 1.

The shape, material and/or dimensions of the adapter 12 are "tuned" to at least partially if not substantially reduce or otherwise eliminate the transmission of erratic strain, which is generated by the work piece 11 in response to ultrasonic vibrations, back to the piezoelectric actuators 14 of the ultrasonic transducer assembly 10. With reference to FIGS. 2-4, for example, the adapter 12 may be integrally formed as a unitary, single-piece frustaconical structure that is fabricated from a metallic material, such as aluminum or titanium. For some implementations, the adapter 12 consists essentially or solely of the structure shown in FIG. 2. It may be desirable, for some preferred embodiments, that the adapter 12 be fabricated from 2024-T351 Aluminum. The proximal end of the adapter 12 has a first diameter D1, e.g., of approximately 3.00 inches, whereas the distal end of the adapter 12 has a second diameter D2, e.g., of approximately 6.00 inches, that is larger than the first diameter D1. To avoid undesirable and/or excessive stress in the adapter 12, the outer diameter of the adapter 12 progressively increases when transitioning from the first diameter D1 at the proximal end to the second diameter D2 at the distal end of the adapter 12. For instance, a transitional section of the adapter 12 between the proximal and distal ends thereof has a radius of curvature R2 of approximately 1.5 in. The overall length L1 of the adapter 12 can be approximately 5.00 in. to approximately 5.50 in. The resonant frequency of the adapter, which is approximately 20,000 Hz+/−50 Hz in some embodiments, can be adjusted by changing the overall length L1 of the adapter 12. The size of D1, D2 and/or L1 may be selectively modified, for example, when installing the adapter 12 into stacks with frequencies other than 20,000 Hz or to mount to different sized non-resonant components while maintaining the same approximate shape of the adapter.

The adapter 12 may also be configured to ensure that the ultrasonic transducer assembly 10 vibrates with a simple axial motion (e.g., expansion and contraction of the actuators 14 is predominantly along the primary axis A1) when the work piece 11 vibrates in an erratic manner in response to ultrasonic excitation by the assembly 10. In the illustrated embodiment, for example, the distal end of the adapter 12 has a raised contact surface 32 that at least partially or, as shown, completely surrounds a recessed attachment surface 34. The raised contact surface 32, which extends continuously along the outer edge of the distal end of the adapter 12, abuts the work piece 11 while the recessed attachment surface 34, which is sunken or otherwise offset from the raised contact surface 32, e.g., by a depth of approximately 0.02 in., attaches to the work piece 11 in the manner described above. By providing the raised contact surface 32, the adapter 12 separates the wheel rim 11 from the plane of the adapter 12 to which the wheel rim 11 is rigidly attached. The shape, material and dimensions of the adapter 12 cooperatively ensure that the raised contact surface 32 exhibits the maximum vibrational amplitude when the adapter 12 is excited by the piezoelectric actuators 14. During excitation, the recessed attachment surface 34 and the flared distal end of the adapter 12 provide more flexibility—allows the distal end of the adapter 12 to flex and deform more freely—than a blunt ended structure without such a recess or such a flared region.

Figure 5:
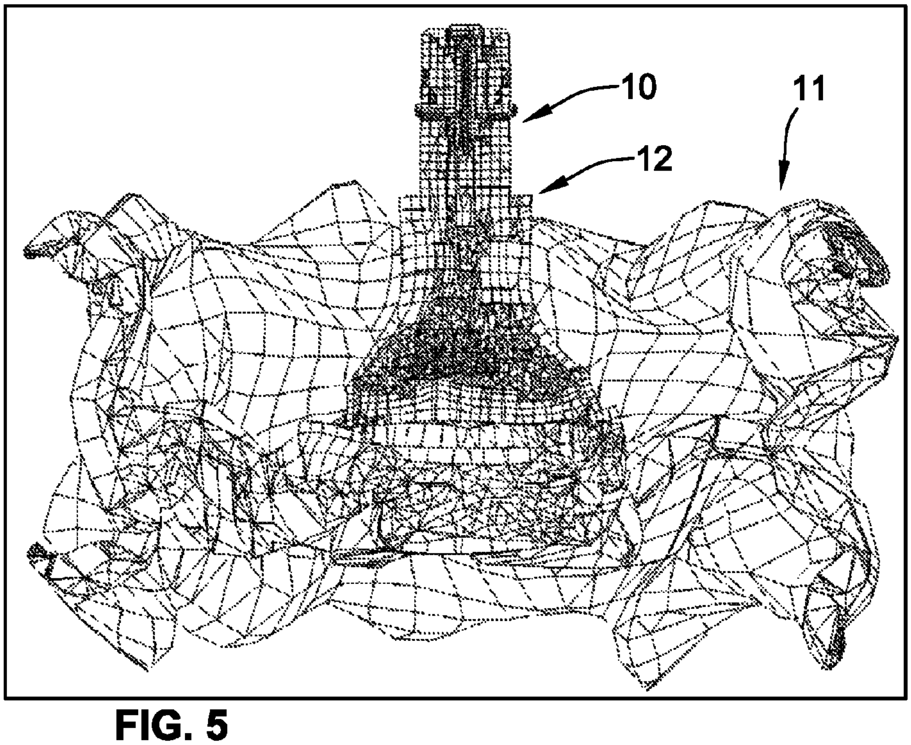
FIG. 5 is a finite element analysis (FEA) simulation of the adapter of FIG. 1 connecting a representative ultrasonic transducer assembly to a representative non-resonant structure.

FIG. 5 is a computer generated finite element analysis (FEA) simulation of a representative adapter component 12, which is configured in accordance with aspects of the present disclosure, connecting an ultrasonic transducer 10 to a non-resonant structure 11 (e.g., an automobile wheel). Although the non-resonant structure 11 viewed in FIG. 5 is highly distorted during excitation—this distorted portrayal being the manner in which FEA computer simulations present erratic strain—the ultrasonic transducer 10 and the proximal end of the adapter 12 are not distorted or show very little distortion aside from the desired "axial" distortion along axis A1. What can be gathered from FIG. 5 is that the adapter configuration enables the adapter 12 to pass significant amplitude vibrational motion from the ultrasonic transducer 10 to the non-resonant structure 11 while not passing non-axial motion from the non-resonant structure 11 back to the ultrasonic transducer 10. In actual practice, this configuration can provide consistent regulation of the ultrasonic transducer 10 by a conventional ultrasonic power supply. Notably, the arrangement shown in FIG. 5 can be characterized by the absence of a conventional ultrasonic sonotrode and a conventional ultrasonic booster.

Figure 6:
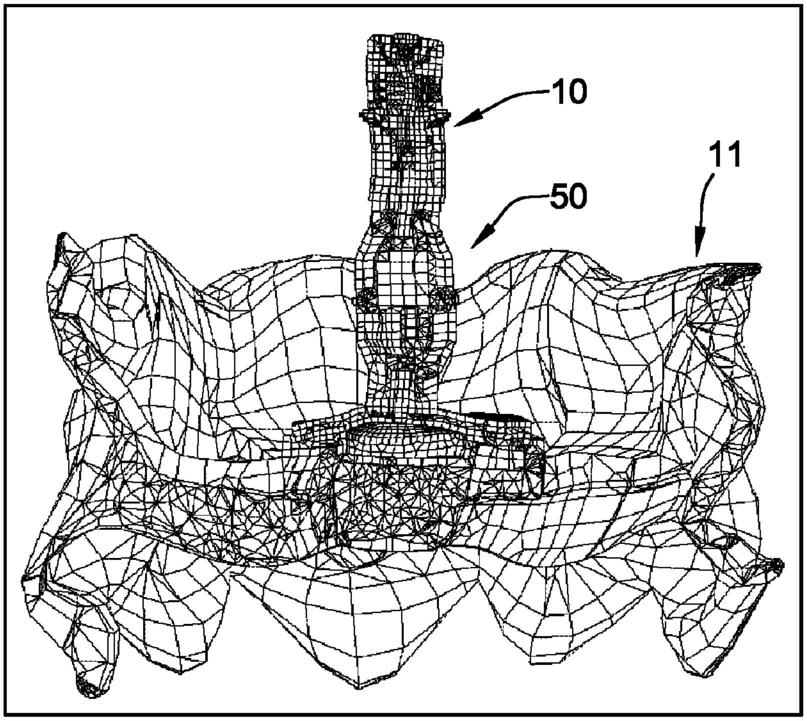
FIG. 6 is a comparative FEA simulation of a conventional ultrasonic booster connecting an ultrasonic transducer assembly to a representative non-resonant structure.

By way of contrast and comparison, FIG. 6 is an FEA simulation of a conventional ultrasonic booster 50 connecting the ultrasonic transducer 10 to the non-resonant structure 11. Like the FEA simulation in FIG. 5, the non-resonant structure 11 shown in FIG. 6 is highly distorted; in stark contrast to FIG. 5, however, the ultrasonic transducer 10 and the ultrasonic booster 50 of FIG. 6 exhibit notable distortion in directions other than along the desired "axial" direction of axis A1. What can be gathered then from FIG. 6 is that the conventional ultrasonic booster 50 passes significant non-axial motion from the non-resonant structure 11 back to the ultrasonic transducer 10. Transmission of non-axial motion back to the ultrasonic transducer 10 in this manner results in non-uniform compression to the piezoelectric actuators which in turn generates irregular voltages and, thus, erratic feedback to the ultrasonic power supply. In actual practice, this typically results in non-repeatable regulation of the transducer 10 by a conventional ultrasonic power supply. In particular, the vibrational amplitude tends to be inconsistent which leads to excessive power draw that will trigger error codes in the feedback system.

A method for using an ultrasonic transducer assembly on a work piece is also disclosed herein. The ultrasonic transducer assembly includes piezoelectric actuators for generating ultrasonic vibrations in response to electrical signals. The method includes, for example, attaching an adapter to the ultrasonic transducer assembly such that the adapter receives the ultrasonic vibrations from the piezoelectric actuators. The method further requires attaching the adapter to the work piece such that the adapter distributes the ultrasonic vibrations from the piezoelectric actuators to the work piece. Thereafter, the method includes introducing a high-frequency electrical signal to the piezoelectric actuators. The adapter is configured to at least partially reduce transmission back to the piezoelectric actuators of erratic strain generated by the work piece in response to the ultrasonic vibrations.

While many embodiments and modes for carrying out the present invention have been described in detail above, those familiar with the art to which this invention relates will recognize various alternative designs and embodiments for practicing the invention within the scope of the appended claims.

What is claimed is:

1. An ultrasonic transducer assembly for generating and transmitting ultrasonic energy to a work piece, the ultrasonic transducer assembly comprising:

a plurality of piezoelectric actuators configured to generate ultrasonic vibrations in response to electrical signals;

a feedback system operable to monitor and regulate a voltage applied to the piezoelectric actuators; and an adapter operatively connected to the piezoelectric actuators and configured to distribute the ultrasonic vibrations from the piezoelectric actuators to the work piece, the adapter being further configured to at least partially reduce transmission back to the piezoelectric actuators of erratic strain generated by the work piece in response to the ultrasonic vibrations, wherein the adapter has opposing proximal and distal ends, the proximal end being attached proximal to the piezoelectric actuators, and the distal end having a raised contact surface at least partially surrounding a recessed attachment surface, the raised contact surface being configured to abut the work piece and the recessed attachment surface being configured to attach to the work piece, and wherein the recessed attachment surface of the distal end of the adapter has a predetermined bolt-hole pattern configured to mechanically couple to the work piece.

2. An ultrasonic transducer assembly for generating and transmitting ultrasonic energy to a work piece, the ultrasonic transducer assembly comprising:

a plurality of piezoelectric actuators configured to generate ultrasonic vibrations in response to electrical signals;

a feedback system operable to monitor and regulate a voltage applied to the piezoelectric actuators; and an adapter operatively connected to the piezoelectric actuators and configured to distribute the ultrasonic vibrations from the piezoelectric actuators to the work piece, the adapter being further configured to at least partially reduce transmission back to the piezoelectric actuators of erratic strain generated by the work piece in response to the ultrasonic vibrations, wherein the adapter is a frustaconical structure with opposing proximal and distal ends, the proximal end being attached proximal to the piezoelectric actuators and the distal end being configured to attach to the work piece, the proximal end having a first diameter and the distal end having a second diameter larger than the first diameter.

3. The ultrasonic transducer assembly of claim 2, wherein an outer diameter of the adapter progressively increases from the first diameter at the proximal end to the second diameter at the distal end of the adapter.

4. A coupling adapter for an ultrasonic transducer assembly operable to generate and transmit ultrasonic energy to a non-resonant structure, the coupling adapter comprising:

a frustoconical single-piece body with opposing proximal and distal ends, the proximal end being configured to couple to the ultrasonic transducer assembly, and the distal end having a raised contact surface circumscribing a recessed attachment surface, the raised contact surface being configured to abut the non-resonant structure and the recessed attachment surface being configured to couple to the non-resonant structure, the proximal end having a first diameter and the distal end having a second diameter larger than the first diameter.

5. An ultrasonic transducer system for generating and transmitting ultrasonic energy to a work piece, the ultrasonic transducer system comprising:

an actuator assembly with one or more actuators configured to generate ultrasonic vibrations in response to an activating stimulus;

a control assembly connected to the actuator assembly to selectively apply the activating stimulus to the one or more actuators; and an adapter mechanically coupled to the actuator assembly and configured to mechanically couple to the work piece, the adapter having a single-piece frustaconical metallic body structurally configured to distribute the ultrasonic vibrations from the one or more actuators to the work piece and configured to reduce transmission back to the one or more actuators of erratic strain generated by the work piece in response to the ultrasonic vibrations.

6. The ultrasonic transducer system of claim 5, wherein the recessed attachment surface of the distal end of the adapter body has a predetermined bolt-hole pattern for mechanically coupling the adapter to the work piece.

* * * * *